US006818938B1

United States Patent
Naem

(10) Patent No.: US 6,818,938 B1
(45) Date of Patent: Nov. 16, 2004

(54) MOS TRANSISTOR AND METHOD OF FORMING THE TRANSISTOR WITH A CHANNEL REGION IN A LAYER OF COMPOSITE MATERIAL

(75) Inventor: Abdalla Aly Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 20 days.

(21) Appl. No.: 10/315,300

(22) Filed: Dec. 10, 2002

(51) Int. Cl.[7] .................................................. H01L 27/108

(52) U.S. Cl. .......................... 257/302; 257/77; 257/192; 257/194; 438/285

(58) Field of Search ............................. 438/285; 257/77, 257/192, 194

(56) References Cited

U.S. PATENT DOCUMENTS

| | | | |
|---|---|---|---|
| 6,190,975 B1 * | 2/2001 | Kubo et al. ................. | 438/285 |
| 6,399,970 B2 * | 6/2002 | Kubo et al. ................. | 257/194 |
| 6,472,685 B2 | 10/2002 | Takagi ........................ | 257/77 |
| 6,492,216 B1 | 12/2002 | Yeo et al. .................... | 438/197 |
| 6,597,016 B1 * | 7/2003 | Yuki et al. ................... | 257/77 |

* cited by examiner

Primary Examiner—David Nelms
Assistant Examiner—Mai-Huong Tran
(74) Attorney, Agent, or Firm—Mark C. Pickering

(57) ABSTRACT

The vertical diffusion of dopants from the gate and the bulk material into the channel region, and the lateral diffusion of dopants from the source and drain regions into the channel region resulting from thermal cycling during the fabrication of a MOS transistor is minimized by forming the source and drain regions in a layer of composite material that includes silicon, germanium, and carbon.

13 Claims, 5 Drawing Sheets

MOS TRANSISTOR AND METHOD OF FORMING THE TRANSISTOR WITH A CHANNEL REGION IN A LAYER OF COMPOSITE MATERIAL

RELATED APPLICATION

The present invention is related to application Ser. No. 10/315,394 for "MOS Transistor and Method of Forming a MOS Transistor with a Layer of Silicon Germanium Carbon" by Abdalla Aly Naem and Visvamohan Yegnashankaran filed on an even date herewith.

DETAILED DESCRIPTION OF THE INVENTION

Figure 1:
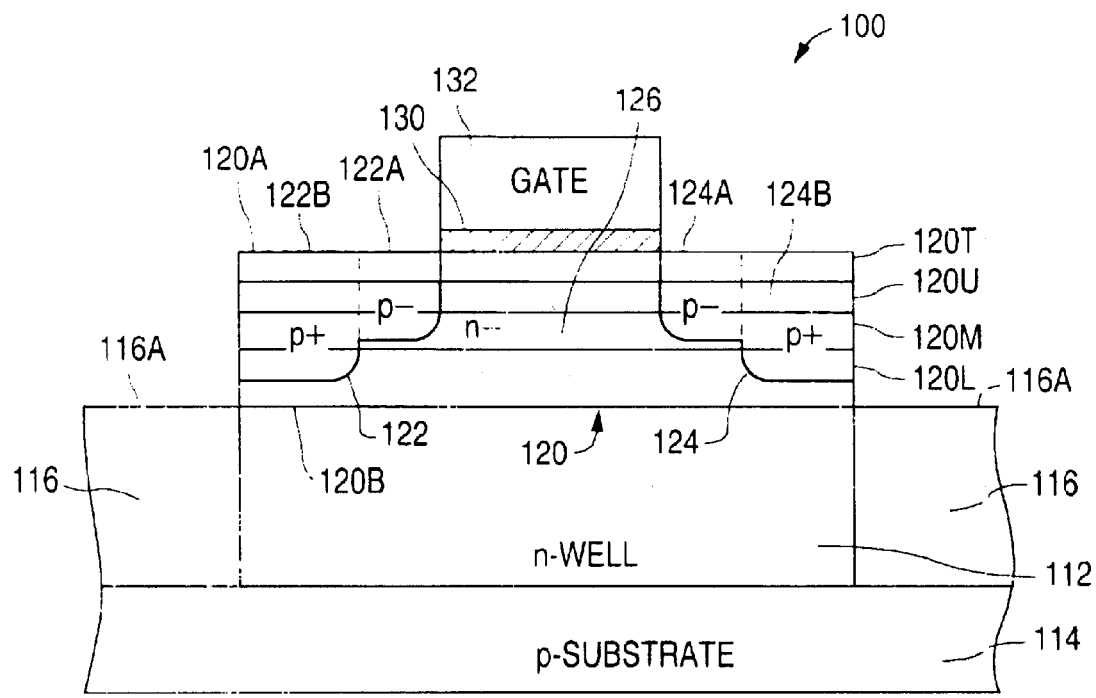
FIG. 1 is a cross-sectional view illustrating an example of a PMOS transistor 100 in accordance with the present invention.

FIG. 1 shows a cross-sectional view that illustrates an example of a PMOS transistor 100 in accordance with the present invention. As described in greater detail below, PMOS transistor 100 utilizes a layer of composite material to limit the diffusion of boron atoms into the channel region of the transistor, thereby minimizing undesired changes in the threshold voltage and channel length of the transistor.

As shown in FIG. 1, PMOS transistor 100 is formed in an n-type semiconductor material 112, such as a substrate or well. In the FIG. 1 example, material 112 is formed as an n-type well in a p-type substrate 114. In addition, material 112 is surrounded by a trench isolation region 116 that has a substantially planar upper surface 116A. (An isolation region with a non-planar upper surface can alternately be used.)

As further shown in FIG. 1, transistor 100 includes a layer of composite material 120 that is formed on semiconductor material 112. In the FIG. 1 example, composite layer 120 has an upper surface 120A, and a lower surface 120B that is substantially coplanar with the upper surface 116A of trench isolation region 116.

In the present invention, composite layer 120 includes a layer of n– silicon carbon 120L that is formed on semiconductor material 112, and a layer of n– silicon germanium 120M, which is substantially free of carbon, that is formed over the layer of silicon carbon 120L. (Layer 120L can optionally include germanium.)

In addition, composite layer 120 includes a layer of n– silicon germanium carbon 120U that is formed over the layer of silicon germanium 120M, and a cap silicon layer 120T that is formed on silicon germanium carbon layer 120U. (Cap silicon layer 120T can optionally be omitted. Layer 120T allows a higher quality of gate oxide to be produced during manufacturing.) Composite layer 120 can alternately be formed to have additional layers.

The layers 120T, 120U, 120M, and 120L can have any thickness required by the device design. For example, silicon carbon layer 120L can be 30 nM thick, silicon germanium layer 120M can be 20 nM thick, silicon germanium carbon layer 120U can be 10 nM thick, and cap silicon layer 120T can be 10 nM thick.

Transistor 100 also includes spaced-apart p-type source and drain regions 122 and 124 that are formed in composite layer 120, and a channel region 126 that is located between source and drain regions 122 and 124. Source and drain regions 122 and 124 can be formed entirely within layer 120, or can alternately extend into material 112.

Further, as shown in the FIG. 1 example, source region 122 includes a lightly-doped p-type region 122A and heavily-doped p-type region 122B, while drain region 124 includes a lightly-doped p-type region 124A and a heavily-doped p-type region 124B. Alternately, source and drain regions 122 and 124 can have a uniform p+ dopant concentration.

Transistor 100 additionally includes a thin layer of insulation material 130, such as a layer of gate oxide, that is formed on composite layer 120 over channel region 126. Further, transistor 100 includes a p-type polysilicon gate 132 that is formed on insulation layer 130 over channel region 126.

Figure 2:
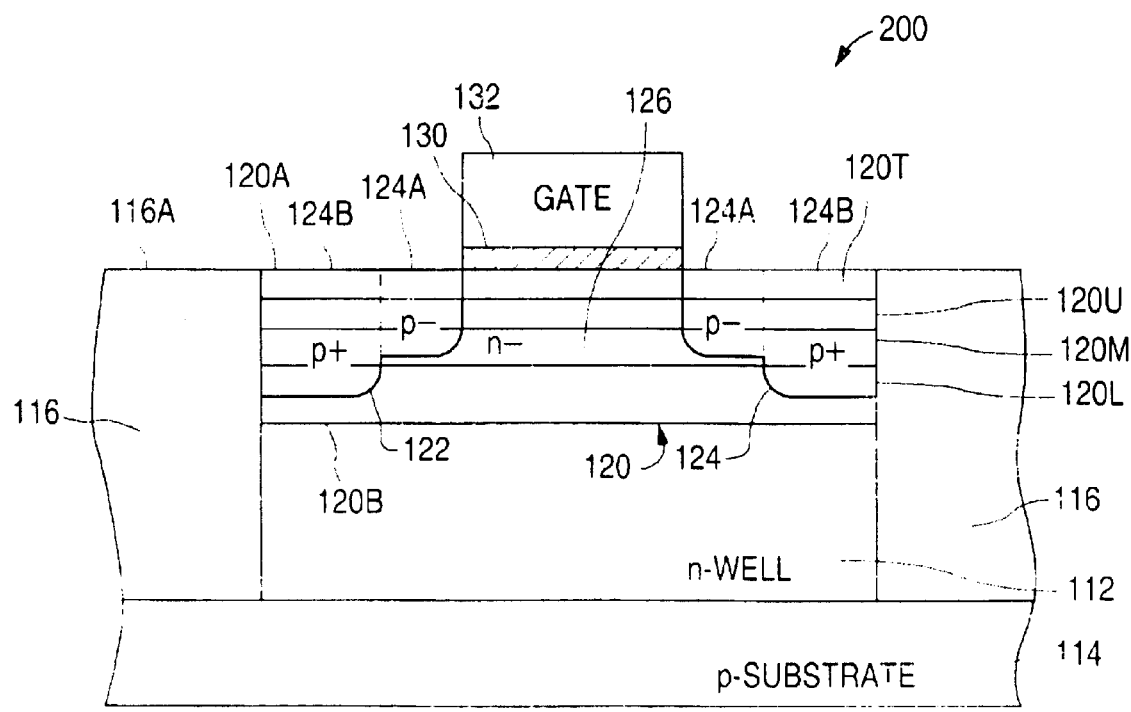
FIG. 2 is a cross-sectional view illustrating an example of a PMOS transistor 200 in accordance with an alternate embodiment of the present invention.

FIG. 2 shows a cross-sectional view that illustrates an example of a PMOS transistor 200 in accordance with an alternate embodiment of the present invention. PMOS transistor 200 is similar to PMOS transistor 100 and, as a result, utilizes the same reference numerals to designate structures that are common to both transistors.

As shown in FIG. 2, transistor 200 differs from transistor 100 with respect to the location of composite layer 120. In transistor 200, the bottom surface 120B of composite layer 120 lies below the top surface 116A of trench isolation region 116, while the top surface 120A of composite layer 120 is substantially coplanar with the top surface 116A of trench isolation region 116. Transistors 100 and 200 are operated in the same way as a conventional MOS transistor such as transistor 100.

One advantage of the present invention is that the, carbon in silicon layers 120U and 120L limits the vertical and lateral diffusion, respectively, of boron atoms into silicon germanium layer 120M of channel region 126 during thermal cycling, such as annealing. As a result, the present invention limits undesirable shifts in the threshold voltage and shortening of the channel length that can lead to punch-through.

Another advantage of the present invention is that by locating the channel region in a silicon germanium layer, as described in the present invention, the mobility of the charge carriers (holes in a p-channel) is increased as compared to a channel region located in a region of silicon.

Figure 3A:
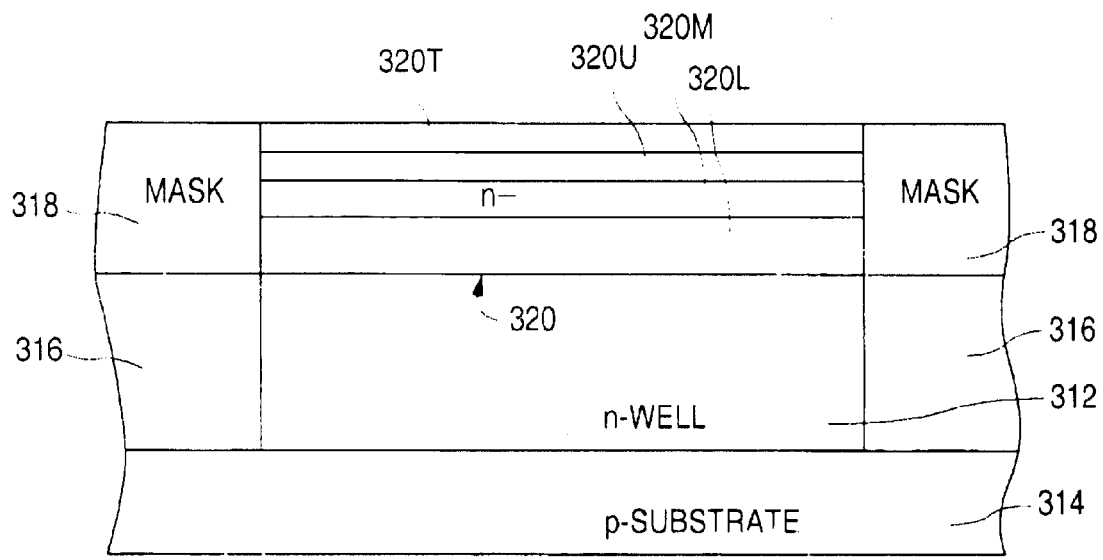
FIGS. 3A–3E are a series of cross-sectional views illustrating an example of a method of forming a PMOS transistor in accordance with the present invention.

FIGS. 3A–3E show a series of cross-sectional views that illustrate an example of a method of forming a PMOS transistor in accordance with the present invention. As shown in FIG. 3A, the method utilizes a conventionally formed wafer that has an n-well 312 that is formed in a p-substrate 314. In addition, the wafer has a trench isolation region 316 that isolates n-well 312 from laterally adjacent regions. Further, n-well 312 and trench isolation region 316 have upper surfaces that are substantially coplanar.

As shown in FIG. 3A, the method begins by forming and patterning a mask 318, such as a hard mask, to expose n-well 312. Next, a layer of composite material 320 is selectively epitaxially grown on the exposed surface of n-well 312.

With selective epitaxial growth, composite layer 320 is only grown on the silicon surface of n-well 312.

Composite layer 320 is formed by first forming a layer of n– silicon carbon 320L on the exposed surface of n-well 312. After this, a layer of n– silicon germanium 320M that is substantially free of carbon is formed on layer 320L, followed by the formation of a layer of n– silicon germanium carbon 320U on layer 320M. Next, a layer of cap silicon 320T that is free of carbon and germanium is optionally formed on layer 320U.

The distribution and concentration of the carbon present in layers 320L and 320U depend on when the carbon is introduced, and the amount of carbon that is introduced, during the selective epitaxial growth process. By introducing and restricting carbon during the growth process, a plurality of silicon sub-layers with different carbon concentrations can be formed.

For example, the introduction of carbon near the beginning of the growth process forms lower silicon carbon layer 320L. Stopping the introduction of carbon and introducing germanium near the middle of the process forms middle silicon germanium layer 320M without carbon. In addition, re-introducing carbon near the end of the growth process forms upper silicon germanium carbon layer 320U. Stopping the introduction of carbon and germanium, in turn, forms cap silicon layer 320T.

Following the formation of composite layer 320, the upper surface of layer 320 can optionally be planarized to create a substantially flat upper surface. The upper surface of composite layer 320 can be planarized using, for example, chemical mechanical polishing. Mask 318 is then removed.

Figure 3B:
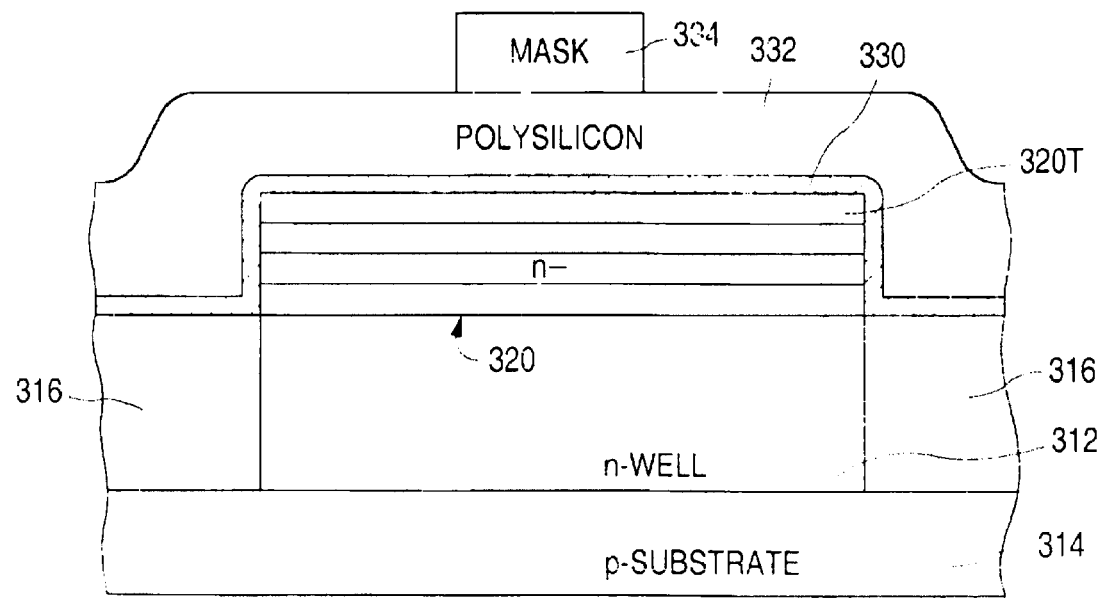

As shown in FIG. 3B, once mask 318 has been removed, a layer of insulation material 330, such as a layer of gate oxide, is formed over the exposed surfaces of composite layer 320. Following this, a layer of polysilicon 332 is formed on gate oxide layer 330. After polysilicon layer 332 has been formed, a mask 334 is formed and patterned on polysilicon layer 332. Next, polysilicon layer 332 is anisotropically etched to remove the exposed regions of layer 332 that are not protected by mask 334. Mask 334 is then removed.

Figure 3C:
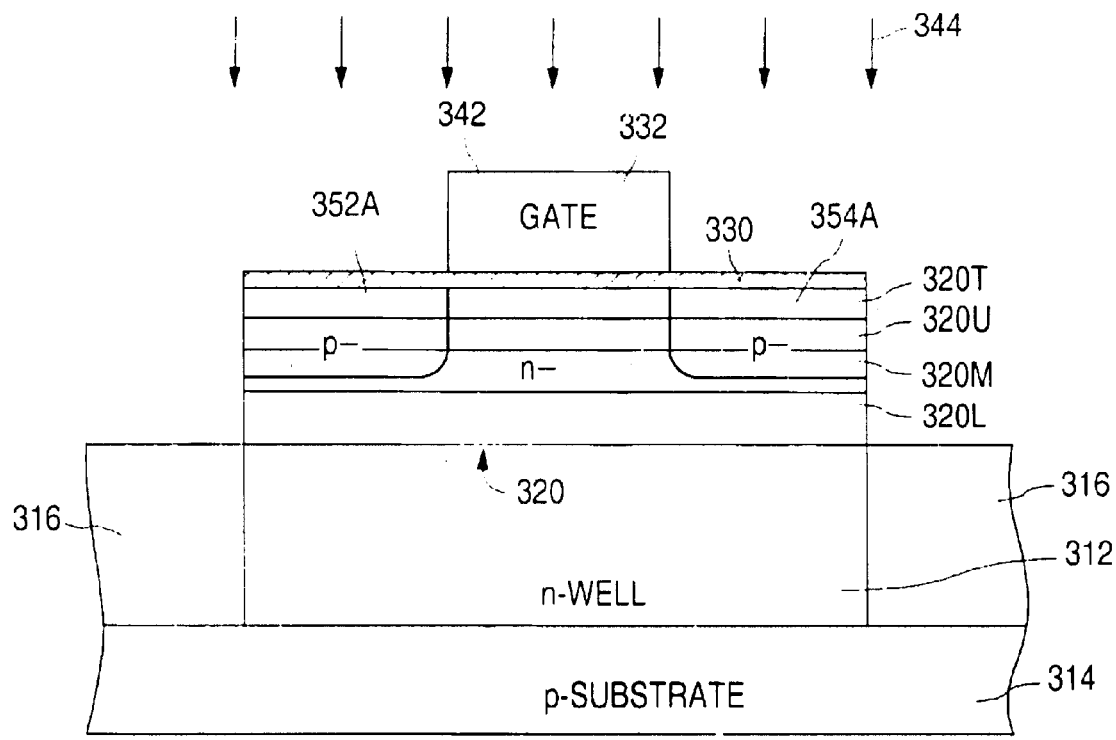
Figure 3D:
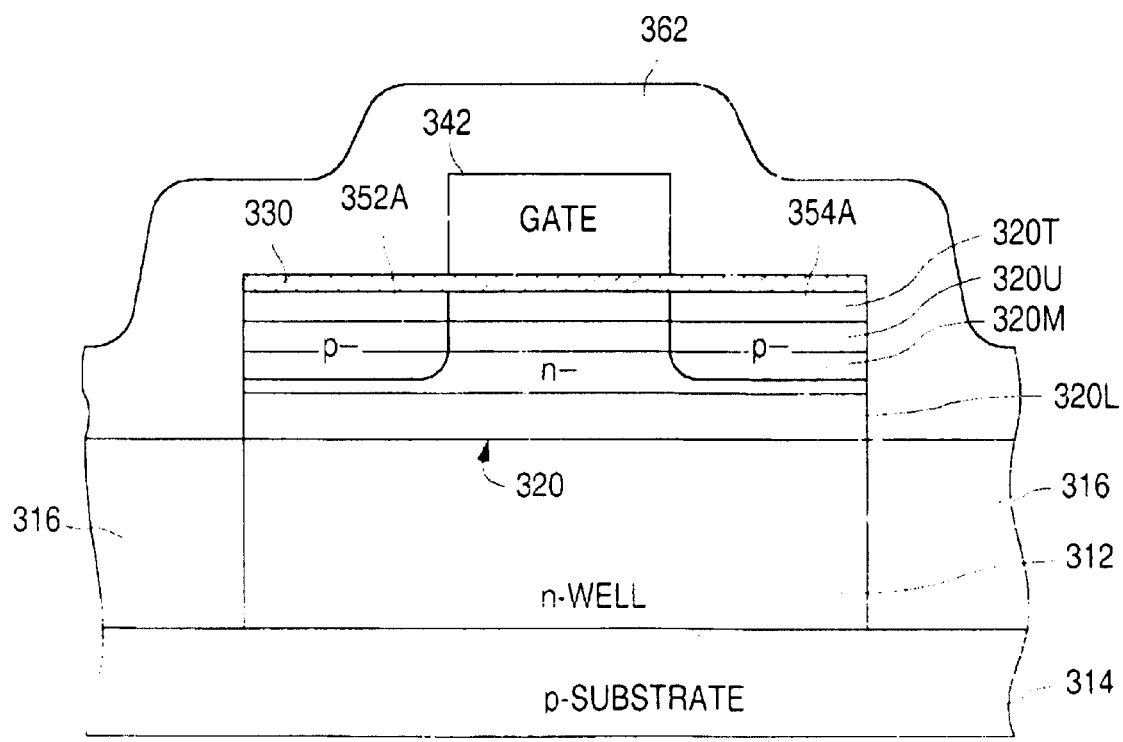

As shown in FIG. 3C, the etch forms a gate 342 from polysilicon layer 332. The method continues by implanting composite layer 320 and gate 342 with a p-type dopant 344. The implant dopes gate 342, and forms lightly-doped p-type regions 352A and 354A in composite layer 320. Turning to FIG. 3D, a layer of insulation material 362, such as an oxide, is next formed over trench isolation region 316, gate oxide layer 330, and gate 342.

Figure 3E:
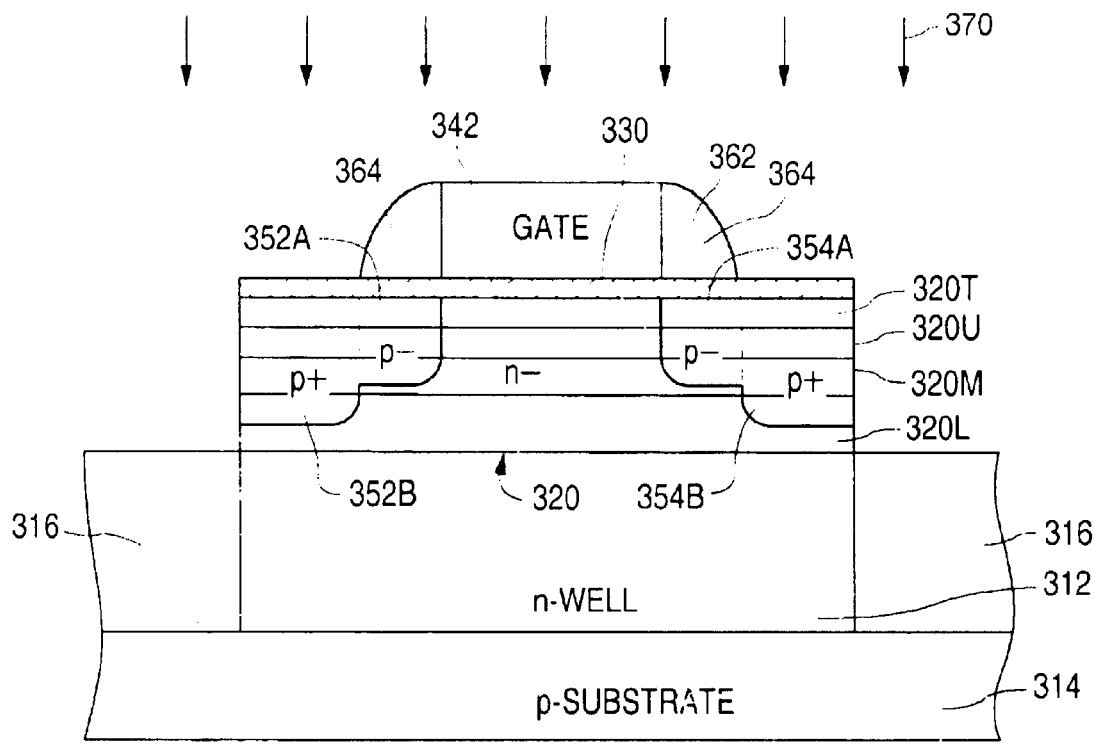

Following this, as shown in FIG. 3E, insulation material 362 is anisotropicly etched to remove insulation material from the top surfaces of trench isolation region 316, portions of layer 330, and gate 342. The anisotropic etch forms an insulating spacer 364 on the side walls of gate 342.

The method continues by again implanting composite layer 320 and gate 342 with p-type dopant atoms 370. During the second implant, insulating spacer 364 blocks dopant atoms from entering the portions of source region 352A and drain region 354A that lie below insulating spacer 364.

The second implant forms a heavily-doped p-type source region 352B that contacts adjacent lightly doped p-type source region 352A. In addition, the second implant also forms a heavily-doped p-type drain region 354B that contacts adjacent lightly-doped p-type drain region 354A. The second implant further dopes gate 342. Following the second implant, the wafer is annealed to repair lattice damage caused by the implants. After the wafer has been annealed, the method continues with conventional back end processing steps.

FIGS. 4A–4D show a series of cross-sectional views that illustrate a method of forming a PMOS transistor in accordance with the present invention. As above, the method utilizes a conventionally formed wafer that has an n-well 412 that is formed in a p-substrate 414. In addition, the wafer has a trench isolation region 416 that isolates n-well 412 from laterally adjacent regions. Further, n-well 412 and trench isolation region 416 have upper surfaces that are substantially coplanar.

Figure 4A:
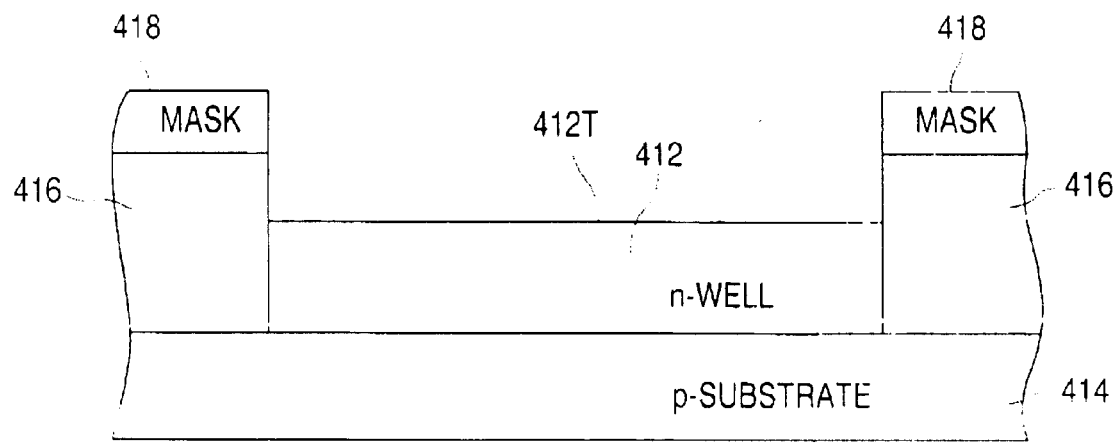
FIGS. 4A–4D are cross-sectional views illustrating an example of a method of forming a PMOS transistor in accordance with an alternate embodiment of the present invention.

As shown in FIG. 4A, the method begins by forming and patterning a mask 418 that exposes n-well 412. Next, the exposed regions of n-well 412 are etched to remove a portion of n-well 412 so that a top surface 412T of n-well 412 is recessed below the top surface of trench isolation region 416. Mask 418 is then removed.

Figure 4B:
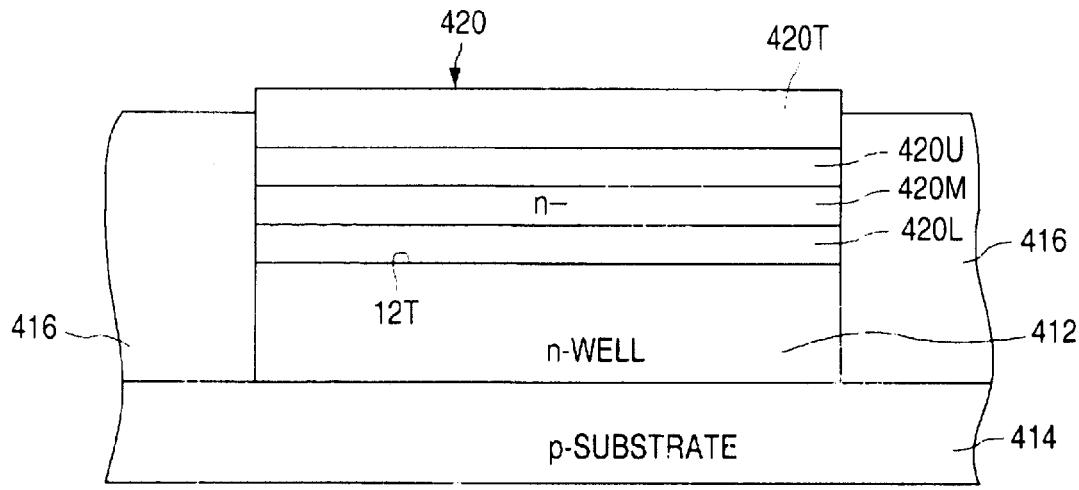

Next, as shown in FIG. 4B, a layer of composite material 420 is selectively epitaxially grown on the recessed surface 412T of n-well 412. (Composite layer 420 can alternately be epitaxially grown.) Composite layer 420 is formed by first forming a layer of n– silicon carbon 420L on the exposed surface of n-well 412. After this, a layer of n– silicon germanium 420M that is substantially free of carbon is formed on layer 420L, followed by the formation of a layer of n– silicon germanium carbon 420U on layer 420M. Next, a layer of cap silicon 420T that is free of carbon and germanium is formed on layer 420U.

Figure 4C:
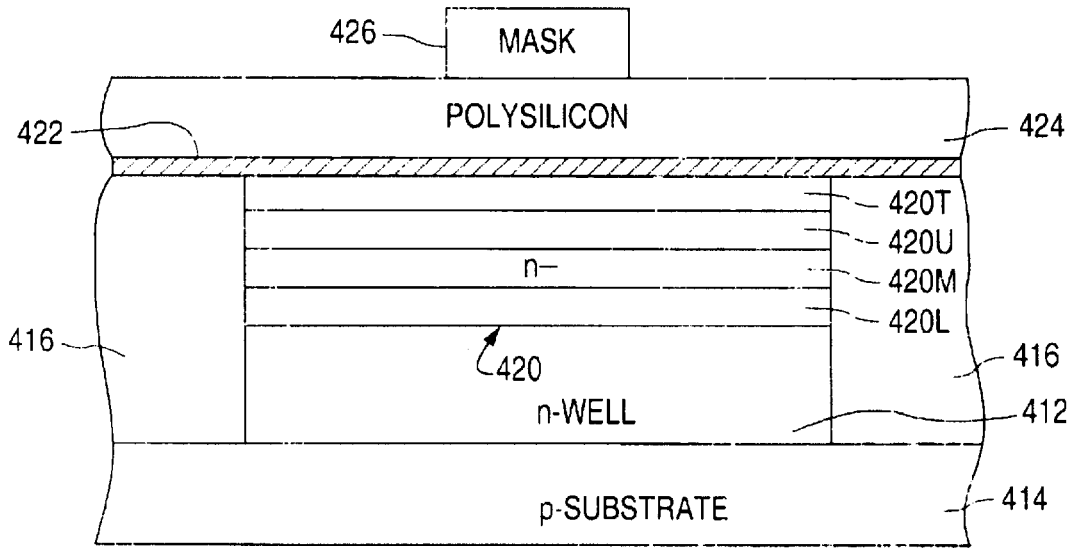

As shown in FIG. 4C, after composite layer 420 has been grown, layer 420 is planarized using, for example, chemical-mechanical polishing. The planarization step forms composite layer 420 with a substantially planar upper surface that is substantially coplanar with the upper surface of trench isolation region 416.

Once composite layer 420 has been formed and planarized, a layer of insulation material 422, such as a layer of gate oxide, is formed over the exposed surfaces of layer 420. Following this, a layer of polysilicon 424 is formed on gate oxide layer 422. After polysilicon layer 424 has been formed, a mask 426 is formed and patterned on polysilicon layer 424.

Figure 4D:
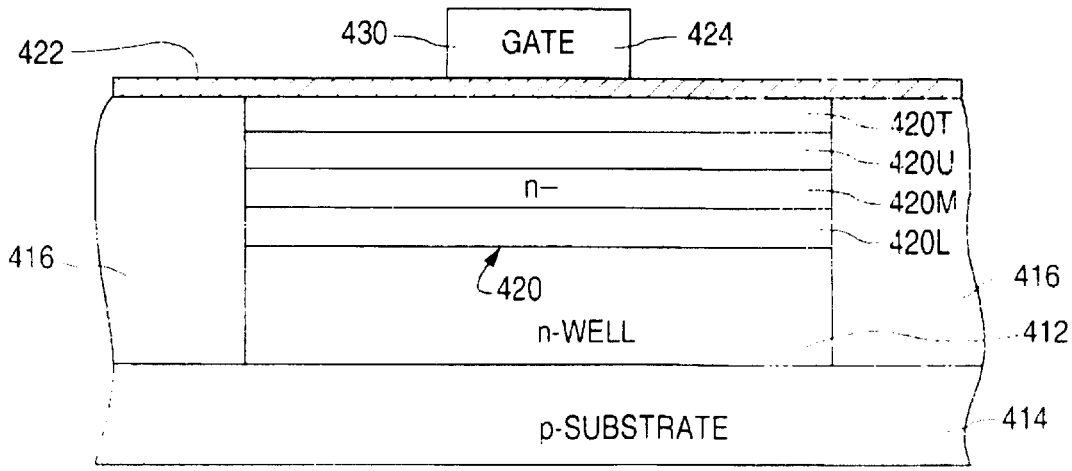

Next, as shown in FIG. 4D, polysilicon layer 424 is anisotropically etched to remove the exposed regions of layer 424 that are not protected by mask 426. Mask 426 is then removed. The etch forms a gate 430 from polysilicon layer 424. The method then continues as described above to form a source region, a spaced-apart drain region, and a side wall spacer. One of the advantages of the formation steps described in FIGS. 4A–4D is that a transistor can be formed that has significantly less variation in surface planarity.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents covered thereby.

What is claimed is:

1. A MOS transistor formed on a semiconductor material of a first conductivity type, the transistor comprising:
   a layer of composite material of the first conductivity type formed on the semiconductor material, the layer of composite material including silicon, germanium, and carbon, the layer of composite material including a plurality of layers, the plurality of layers including a first layer that has silicon and carbon, a second layer formed over and contacting the first layer, and a third layer formed over and contacting the second layer, the second layer having silicon and germanium and being substantially free of carbon, the third layer having silicon, germanium, and carbon atoms;

spaced apart source and drain regions of a second conductivity type formed in the layer of composite material;

a channel region located between the source and drain regions;

an insulation layer formed on the layer of material; and a gate formed on the insulation layer over the channel region.

2. The MOS transistor of claim 1 wherein the plurality of layers includes a fourth layer formed over and contacting the third layer, the fourth layer having silicon and being substantially free of germanium and carbon atoms.

3. The MOS transistor of claim 1 and further including a trench isolation region, the trench isolation region electrically isolating the semiconductor material from laterally adjacent areas.

4. The MOS transistor of claim 1 wherein the trench isolation region has a top surface, the layer of composite material has a bottom surface, and the top surface of the trench isolation region and the bottom surface of the layer of composite material are in substantially a same plane.

5. The MOS transistor of claim 1 wherein the trench isolation region has a top surface, the layer of composite material has a bottom surface, and the top surface of the trench isolation region and the bottom surface of the layer of composite material are not in a same plane.

6. A semiconductor device formed on a semiconductor material, the device comprising:

a composite region of a first conductivity type formed on the semiconductor material, the composite region having a top surface, a dopant concentration, and a plurality of layers of material, the plurality of layers of material including silicon, germanium, and carbon, the plurality of layers of material including a first layer that has silicon and carbon, a second layer formed over and contacting the first layer, and a third layer formed over and contacting the second layer, the second layer having silicon and germanium and being substantially free of carbon, the third layer having silicon, germanium, and carbon;

spaced-apart first and second diffusion regions of a second conductivity type formed in the composite region, the first and second diffusion regions contacting the top surfaces; and a center region of the composite region located between the spaced-apart first and second diffusion regions, the center region contacting the top surface of the composite region and the first and second diffusion regions.

7. The device of claim 6 wherein the plurality of layers includes a fourth layer formed over and contacting the third layer, the fourth layer having silicon and being substantially free of germanium and carbon atoms.

8. The device of claim 7 wherein the semiconductor material has the first conductivity type.

9. The device of claim 7 and further comprising:

an insulation layer formed on the composite region; and a gate formed on the insulation layer over the center region.

10. The device of claim 7 wherein:

the first diffusion region includes:

a first lightly-doped region that contacts the center region; and a first heavily-doped region that contacts the first lightly-doped region; and the second diffusion region includes:

a second lightly-doped region that contacts the center region; and a second heavily-doped region that contacts the second lightly-doped region.

11. The device of claim 6 wherein the semiconductor material has the first conductivity type.

12. The device of claim 6 and further comprising:

an insulation layer formed on the composite region; and a gate formed on the insulation layer over the center region.

13. The device of claim 6 wherein:

the first diffusion region includes:

a first lightly-doped region that contacts the center region; and a first heavily-doped region that contacts the first lightly-doped region; and the second diffusion region includes:

a second lightly-doped region that contacts the center region; and a second heavily-doped region that contacts the second lightly-doped region.

* * * * *

UNITED STATES PATENT AND TRADEMARK OFFICE
CERTIFICATE OF CORRECTION

PATENT NO.   : 6,818,938 B1
DATED        : November 16, 2004
INVENTOR(S)  : Naem It is certified that error appears in the above-identified patent and that said Letters Patent is hereby corrected as shown below:

<u>Column 4,</u>
Line 59, after "equivalents" insert -- be --.

Signed and Sealed this

Fifteenth Day of February, 2005

JON W. DUDAS
*Director of the United States Patent and Trademark Office*